US006990643B1

(12) United States Patent
McBride

(10) Patent No.: US 6,990,643 B1
(45) Date of Patent: Jan. 24, 2006

(54) METHOD AND APPARATUS FOR DETERMINING WHETHER AN ELEMENT IN AN INTEGRATED CIRCUIT IS A FEEDBACK ELEMENT

(75) Inventor: John G McBride, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/311,313

(22) Filed: May 13, 1999

(51) Int. Cl.
*G06F 9/45* (2006.01)
*G06F 17/50* (2006.01)

(52) U.S. Cl. .............................................. 716/5; 716/4

(58) Field of Classification Search ................ 716/1–2, 716/4–6, 17–18; 703/13–14
See application file for complete search history.

(56) References Cited

U.S. PATENT DOCUMENTS

| | | | | |
|---|---|---|---|---|
| 5,734,798 | A | * 3/1998 | Allred | 395/50 |
| 5,987,237 | A | * 11/1999 | McBride | 703/1 |
| 6,113,648 | A | * 9/2000 | Schuelein et al. | 716/17 |
| 6,182,268 | B1 | * 1/2001 | McElvain | 716/1 |

OTHER PUBLICATIONS

Kuhns, "Automating Testability Analysis of Analog Circuits and Systems," IEEE 1992, pp. 225-231.*
J. Vidkjaer, "Identification of Small-Signal Transistor Models," European Conference on Circuit Theory and Design, 1989, pp. 99-103.*
J. W. Gannett, "Extending an FET Layout Verification System to Bipolar Technology," IEEE 1988 Bipolar Circuit & Technology Meeting, pp. 183-186.*

* cited by examiner

*Primary Examiner*—Leigh M. Garbowski

(57) ABSTRACT

A method and apparatus for evaluating an integrated circuit design to determine whether elements in the integrated circuit are feedback elements. The apparatus comprises a computer capable of being configured to execute a rules checker program which analyzes information relating to the integrated circuit to determine whether or not an element being evaluated is a feedback element. The rules checker program preferably performs a first routine that determines whether an element being evaluated is a feedback element in a special type of circuit. If the first routine determines that it has not detected the special type of circuit, or special case, the rules checker program begins executing a second routine. If the first routine determines that it has detected a special case, the routine ends. The second routine performs several checks to determine whether or not an element being evaluated is a feedback element. The first and second routines are designed to ensure that the order of the checks maximize efficiency in the manner in which the rules checking task is performed, although the invention is not limited to the particular order.

19 Claims, 9 Drawing Sheets

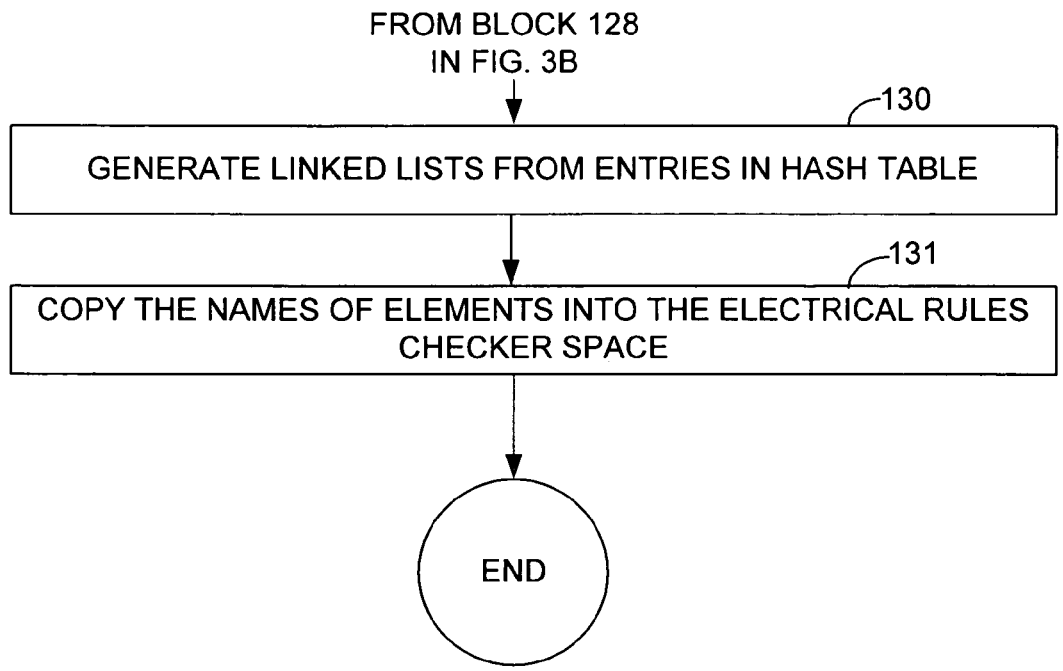
FIG. 3C
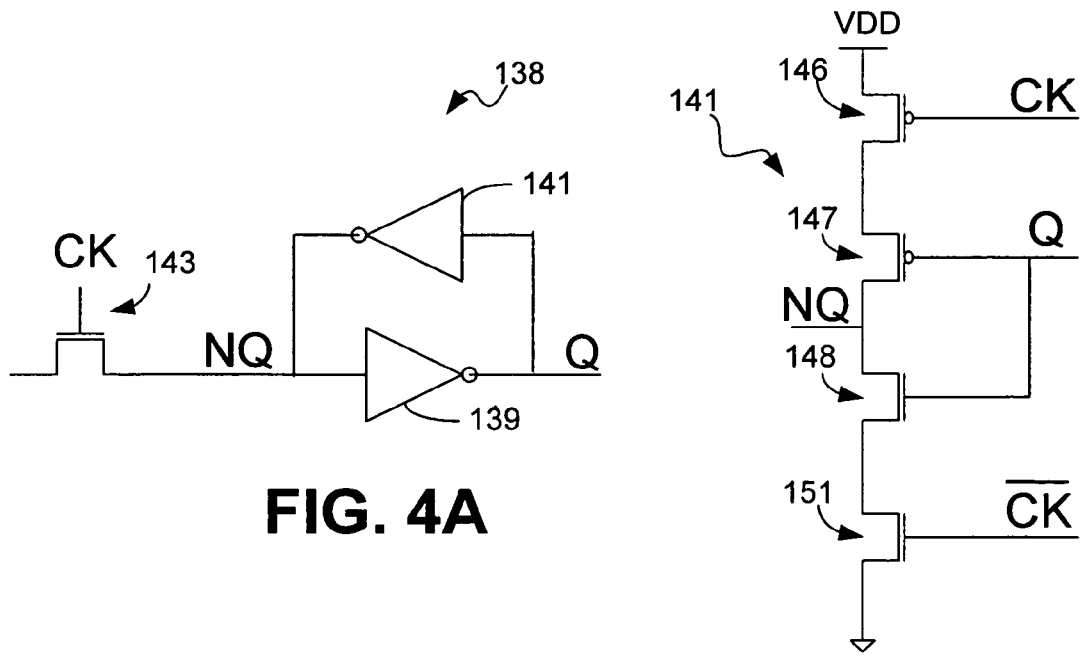
FIG. 4A
FIG. 4B

METHOD AND APPARATUS FOR DETERMINING WHETHER AN ELEMENT IN AN INTEGRATED CIRCUIT IS A FEEDBACK ELEMENT

TECHNICAL FIELD OF THE INVENTION

The present invention generally relates to computer-aided circuit design systems and, more particularly, to a method and apparatus for evaluating the design quality of a network of nodes in an integrated circuit to determine whether or not an element of the network, such as a field effect transistor, is a feedback element.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EE-PROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. The present invention works in conjunction with a tool, such as, for example, PathMill, to build a database which is then utilized by the rules checking system of the present invention to evaluate the design quality of network nodes. Typically, such tools, including PathMill, receive a netlist and use the netlist to determine FET (field effect transistor) direction, node types, latches, dynamic gates, rise and fall times, etc. This information is utilized by the present invention to determine whether or not an element in the integrated circuit is a feedback element.

SUMMARY OF THE INVENTION

The present invention provides a method and apparatus for determining whether or not an element in an integrated circuit is a feedback element. The apparatus comprises a computer capable of being configured to execute a rules checker program. When the rules checker program is executed by the computer, it analyzes information relating to the network and determines whether or not an element in the integrated circuit is a feedback element.

In accordance with the preferred embodiment of the present invention, the rules checker program performs a plurality of checks to determine whether or not an element, such as a FET, in the integrated circuit is a feedback element. The order in which the checks are performed is intended to maximize efficiency in determining whether or not an element being evaluated is a feedback element, although the present invention s not limited with respect to the order in which the checks are performed.

In accordance with the preferred embodiment of the present invention, a first routine is performed by the rules checker program to determine whether or not the circuit comprising the element being evaluated corresponds to a special case. For example, the routine analyzes characteristics of the circuit to determine whether or not the circuit is a zero catcher circuit, which is a well known type of circuit. The special case circuit has a particular structure and the rules checker program analyzes the circuit in relation to the element being evaluated to determine if the circuit has this particular structure. If so, the rules checker program determines that the element being evaluated is the feedback element of the circuit.

If the rules checker determines that the circuit does not correspond to the special case, then the rules checker performs a second routine to determine whether or not the element being evaluated is a feedback element. By looking for the special case first, the rules checker program maximizes the speed with which a determination can be made as to whether or not the element being evaluated is a feedback element. The order in which the steps are performed in the second routine is also selected to maximize the speed with which the rules checker program can definitively determine whether or not the element being evaluated is a feedback element.

Other features and advantages of the present invention will become apparent from the following description, drawings and claims.

BRIEF DESCRIPTION OF THE DRAWINGS

FIGS. 3A–3C together form a flow chart which illustrates the method of the present invention for generating the database of the present invention which can be utilized by the electrical rules checker of the present invention shown in FIG. 2 to perform rules checking tasks.

FIG. 4A is a schematic block diagram of a circuit comprising a recycle loop.

FIG. 4B is a schematic diagram of one of the inverters shown in FIG. 4A.

DETAILED DESCRIPTION OF THE INVENTION

Figure 1:
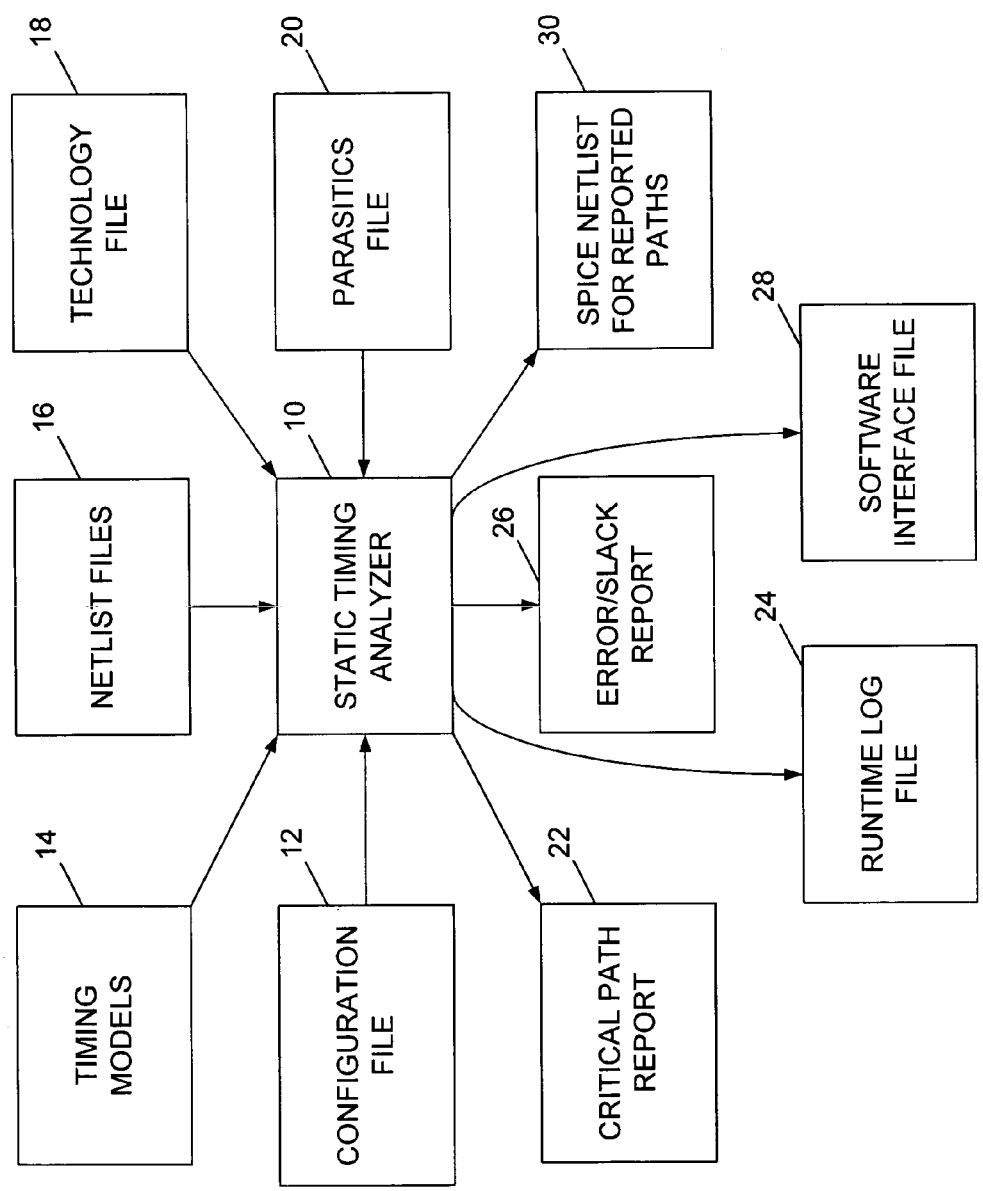
FIG. 1 is a block diagram of a static timing analyzer system, which is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations.

Figure 2:
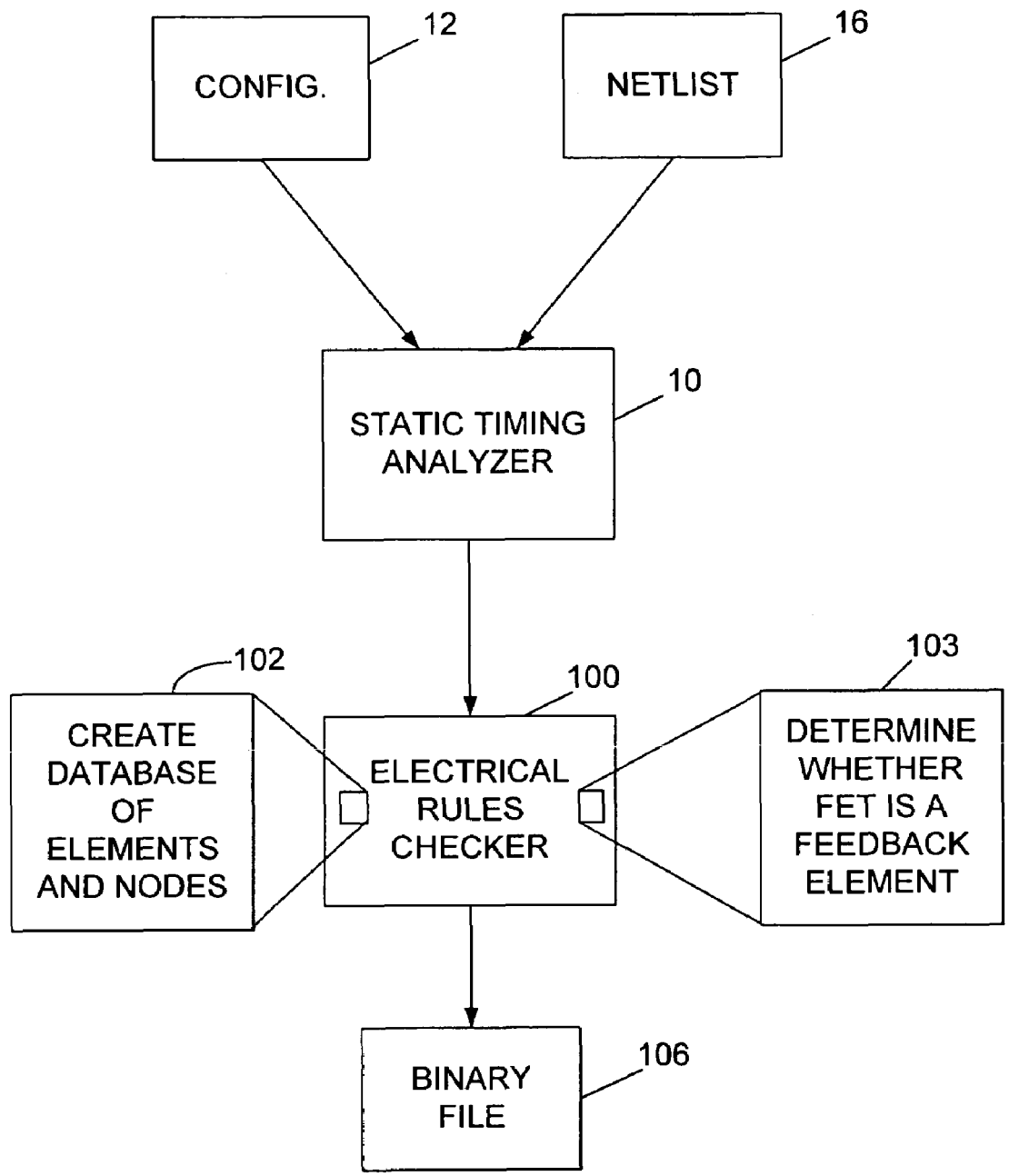
FIG. 2 is a block diagram illustrating the orientation of the electrical rules checker of the present invention in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker program 100 of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks.

The manner in which this database is generated will now be discussed below with respect to FIGS. 3A–3C. For purposes of illustration, it will be assumed that the static timing analyzer 10, shown in FIG. 2 and discussed above, is the Pathmill static timing analyzer, in order to provide an example of one possible implementation of the present invention. However, those skilled in the art will understand that the electrical rules checker 100 of the present invention and the database of the present invention are not limited to use with any particular program.

The Pathmill static timing analyzer provides an application program interface (API) which allows the Pathmill static timing analyzer to communicate with the electrical rules checker 100 of the present invention. This API allows code external to the Pathmill program to be linked to the Pathmill program so that the external code and the Pathmill program itself comprise one executable which can be run as a single program. The electrical rules checker 100 of the present invention utilizes this API to obtain information from the Pathmill static timing analyzer which can be utilized by the electrical rules checker 100 to generate the database of the present invention, as indicated by block 102. This database is then utilized by the rules checker program 100 to perform the task 103 of determining whether FETs in the integrated circuit are feedback elements.

Prior to the database of the present invention being generated, the Pathmill program runs and identifies circuit characteristics of the circuit under consideration such as, for example, FET direction, node types, latches, dynamic gates, clocks, rise and fall times, etc. Before the Pathmill program terminates, it calls the electrical rules checker 100 of the present invention. The Pathmill program has a feature commonly referred to as "hooks", which allows the Pathmill program to call routines at various stages of execution. Once the Pathmill program has finished identifying the characteristics mentioned above, the Pathmill program calls the electrical rules checker 100 of the present invention. The electrical rules checker 100 of the present invention, through this series of subroutine calls, creates its own database of the circuit under consideration.

Figure 3A:
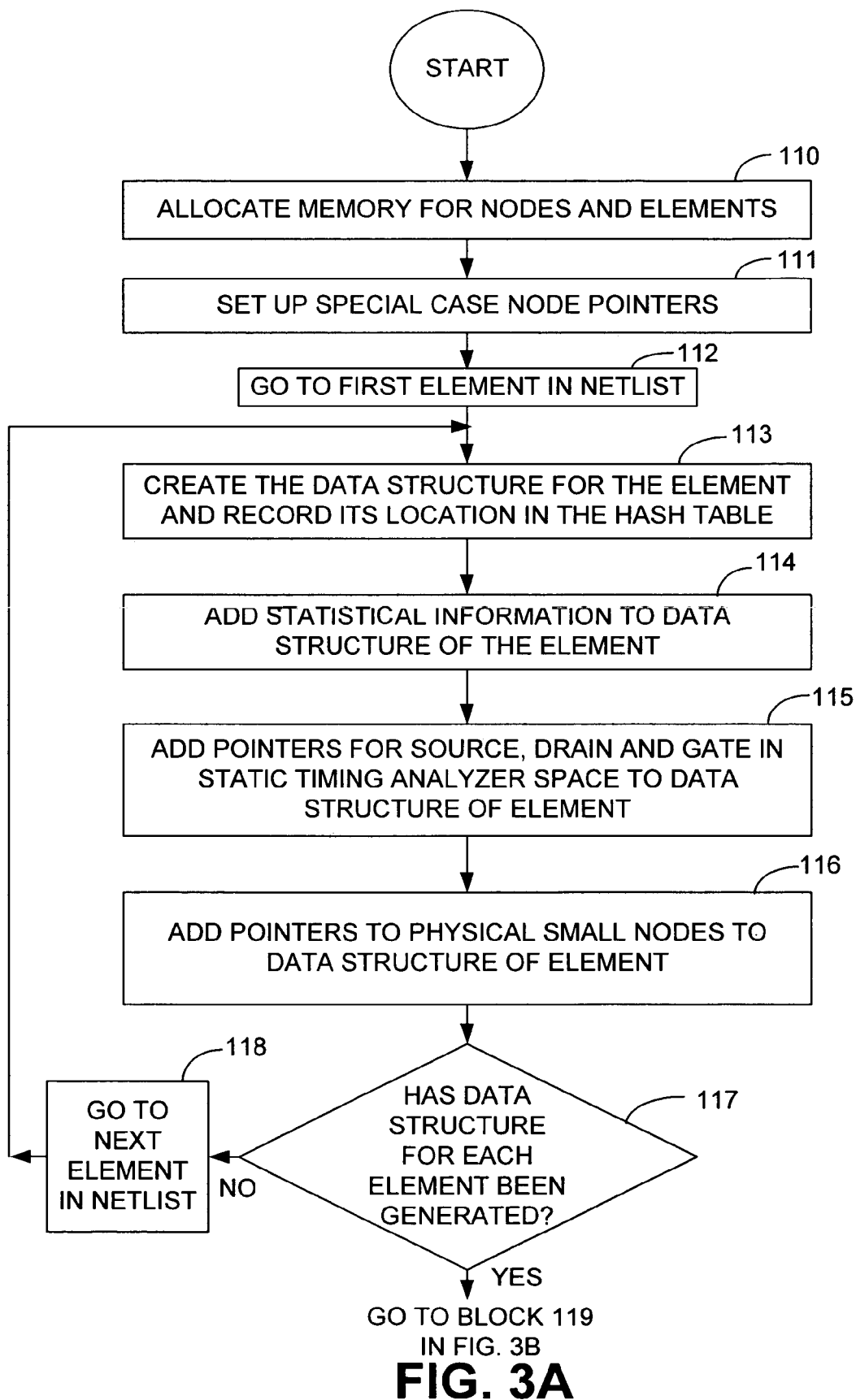
Figure 3B:
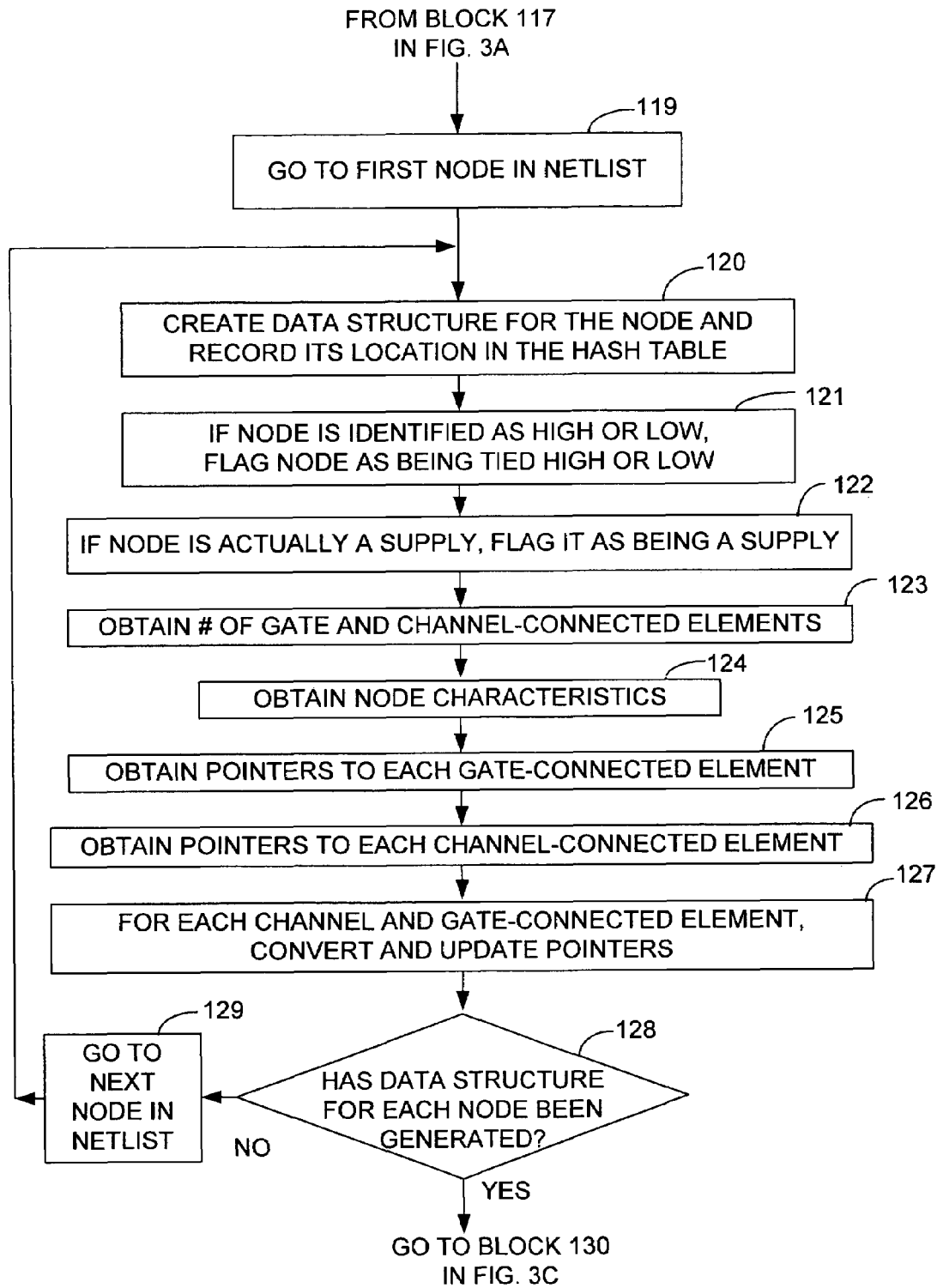

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes are generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags declared or actual high nodes as high and declared or actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention when searching for an element or node in the database of the present invention.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. However, it should be noted that the generation of the database is not critical to the present invention, as will be understood by those skilled in the art. Utilization of the database of the present invention enables the rules checker 100 to maximize efficiency in performing its tasks and reduces the number of API calls to the timing analyzer 10.

As stated above, the electrical rules checker 100 evaluates a circuit to determine whether or not a FET in the circuit is a feedback element. The rules checker 100 of the present invention analyzes a network of nodes to determine whether or not FETs in the network are feedback elements. The manner in which this is accomplished by the rules checker 100 will now be discussed with respect to the circuits shown in FIGS. 4A, 4B and 5 and with reference to the flow charts of FIGS. 6A–7. The circuits of FIGS. 4A and 4B will be used to illustrate the general case wherein a series of general checks, which are demonstrated by the flow charts of FIGS. 6A–6C, are performed to determine whether or not an element is a feedback element.

Figure 5:
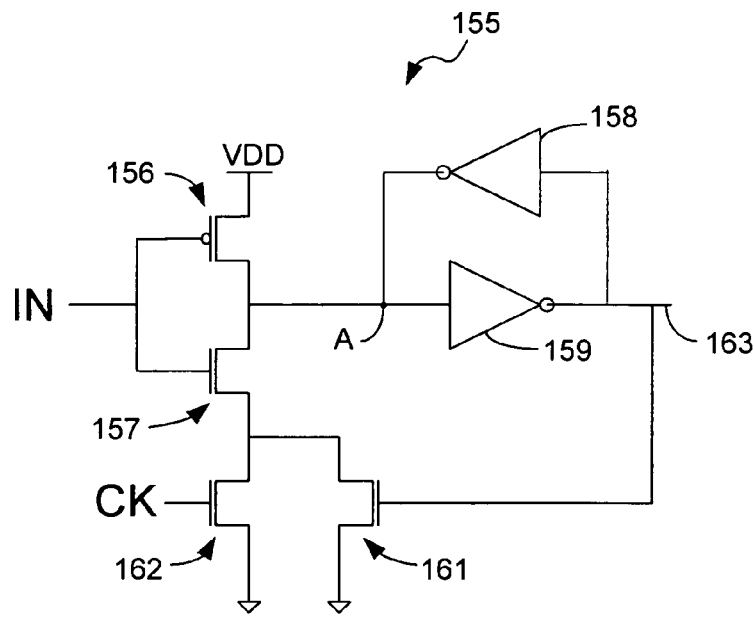
FIG. 5 is a schematic block diagram of a zero catcher circuit.

FIG. 5 is a schematic diagram of a circuit known as a zero catcher circuit, which is well-known in the art of integrated circuit design. The circuit of FIG. 5 will be used to illustrate a preferred embodiment of the present invention wherein, rather than performing the method illustrated in FIGS. 6A–6C, the method of FIG. 7 is performed to determine whether or not a zero catcher circuit (i.e., a special case) has been detected. Preferably, the method of FIGS. 6A–6C is only performed after a determination has been made by the rules checker 100 that the circuit does not represent a special case where a zero catcher circuit has been detected. Those skilled in the art will understand that other special cases may exist which could be detected by the rules checker 100 in order to eliminate the need to perform the method demonstrated by the flow chart of FIGS. 6A–6C.

FIG. 4A illustrates a recycle loop 138 comprised of inverters 139 and 141 which are connected to a pass FET 143 which has a clock connected to its gate. FIG. 4B illustrates a schematic diagram of the inverter 141 shown in FIG. 4A. It can be seen from FIG. 4B that the PFET 147 is a feedback element since it is contained in the recycle loop 138 and is channel-connected to the input NQ of the recycle loop 138. FET 147 will be evaluated in accordance with the method illustrated in FIGS. 6A–6C in order to demonstrate the manner in which the rules checker 100 performs a sequence of checks to determine whether or not a FET is a feedback element. The method of FIGS. 6A–6C could equally be applied to any of the elements in the circuit shown in FIG. 4A. The result would be that FET 143 and any FETs in inverter 139 would be determined not to be feedback elements and only FETs 147 and 148 in FIG. 4B would be found to be feedback elements.

Figure 6A:
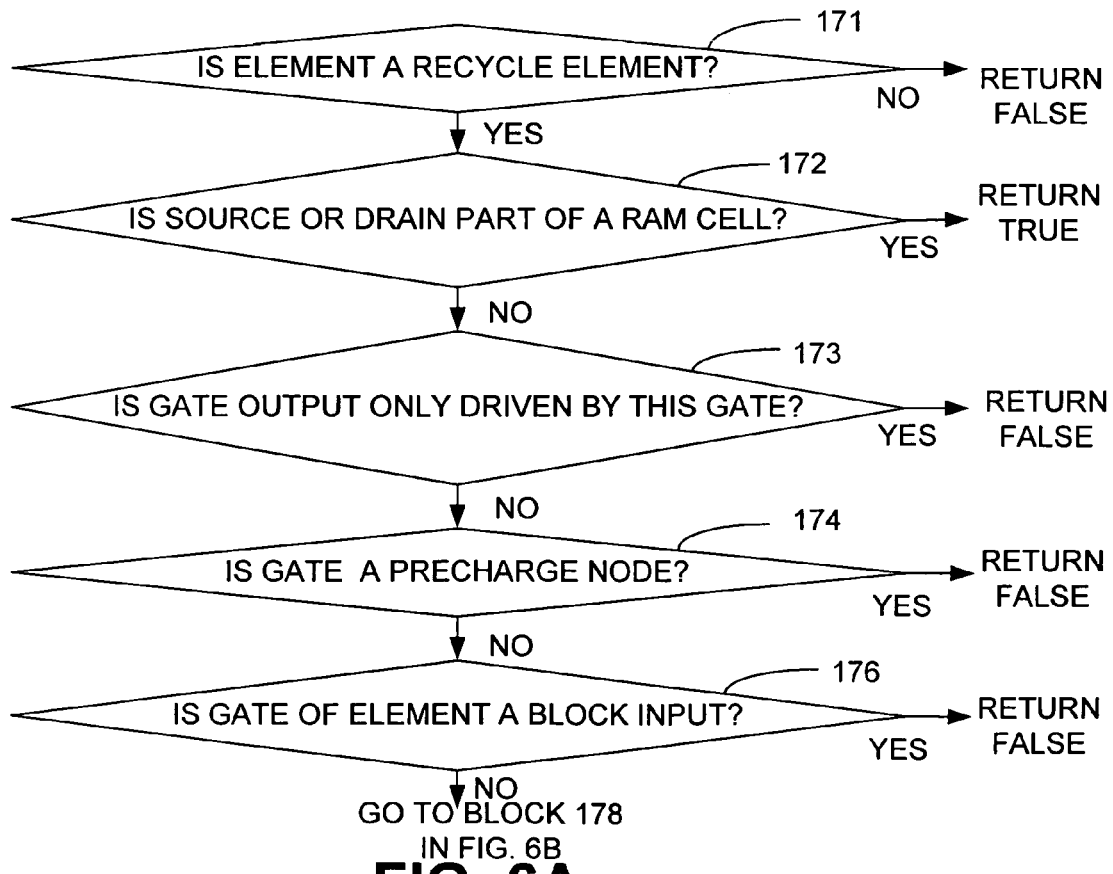
FIGS. 6A–6C together represent a flow chart which provides a detailed illustration of the method of the present invention in accordance with one embodiment for determining whether an element is a feedback element.
Figure 6B:
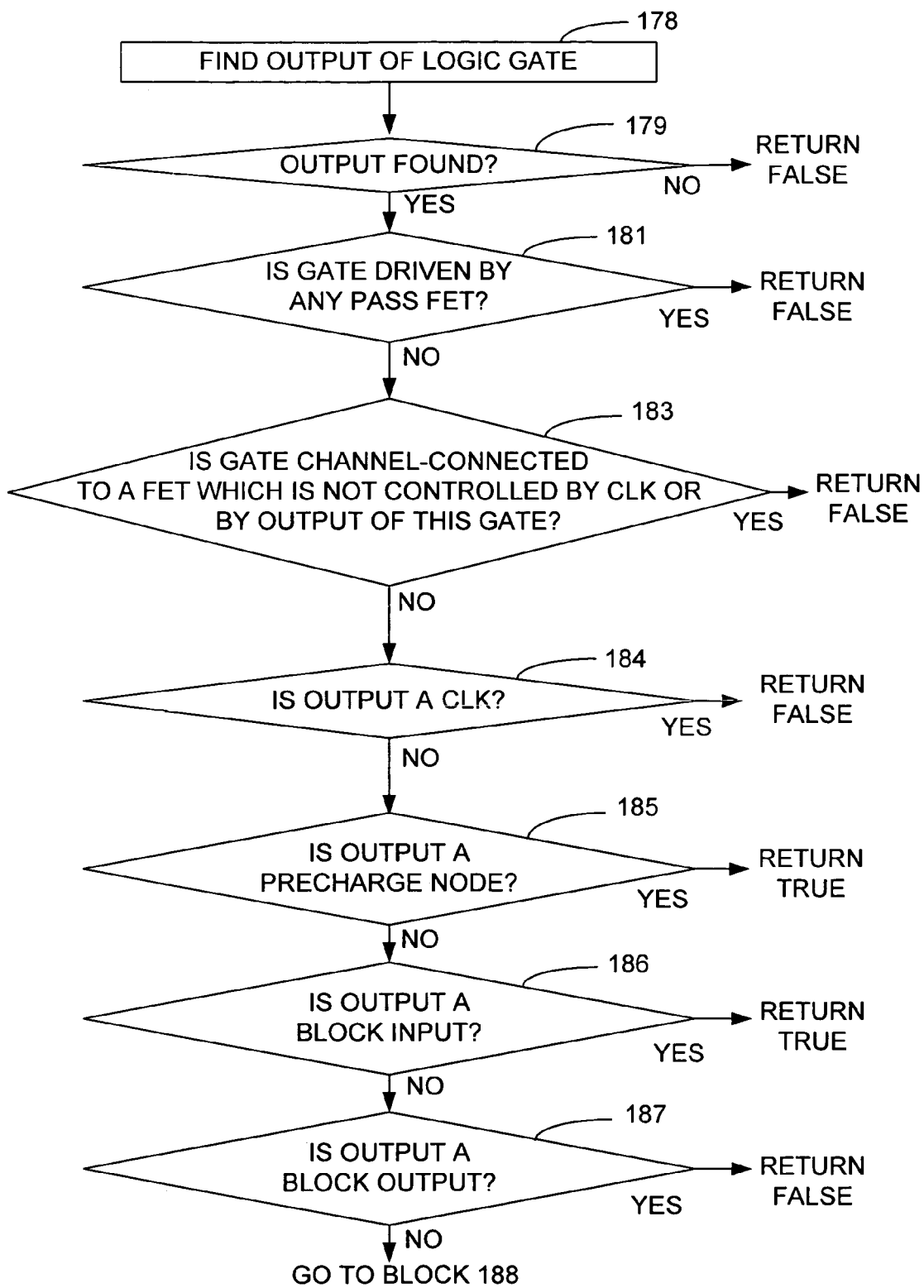
Figure 6C:
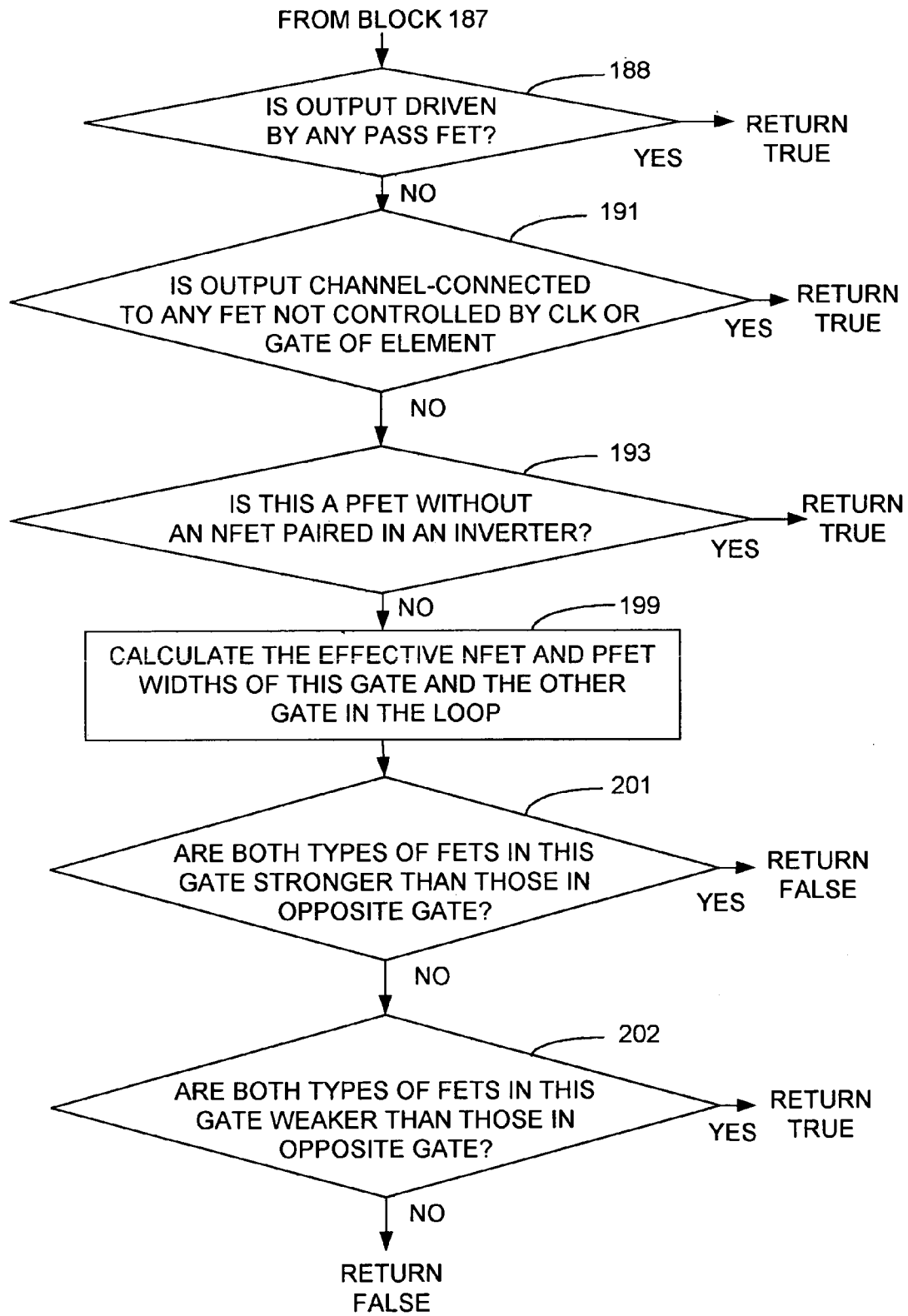
Figure 7:
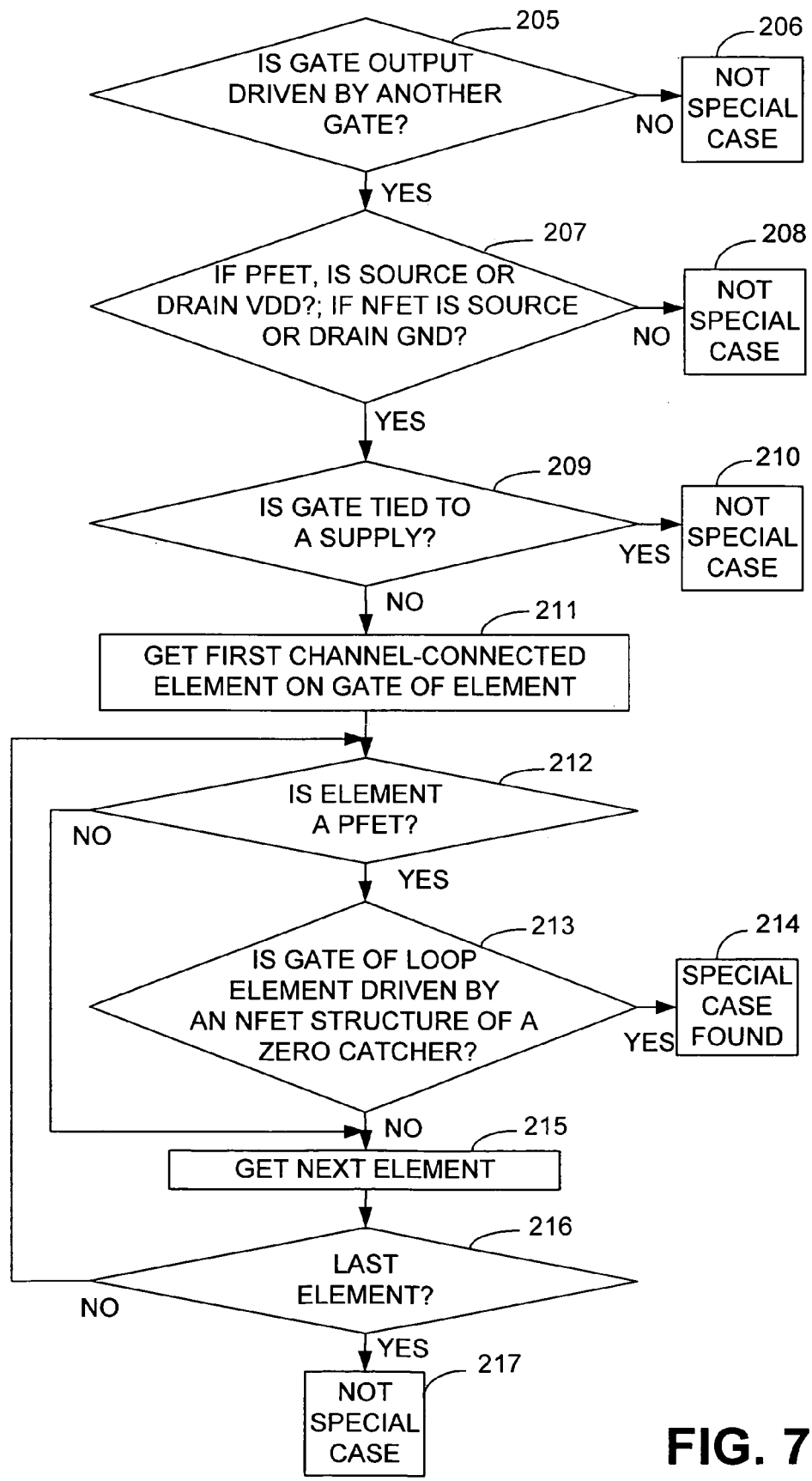
FIG. 7 is a flow chart which provides a detailed illustration of the method of the present invention for determining whether an element is a feedback element of the zero catcher circuit shown in FIG. 5.

Many of the checks performed by the rules checker 100 that are shown in FIGS. 6A–7 utilize information obtained directly from the timing analyzer 10 (e.g., Pathmill) and/or information generated by the rules checker 100 and stored in the aforementioned database. In performing some of the checks, the rules checker 100 simply evaluates flags that have been received from the timing analyzer 10 and placed in the database by the rules checker 100. Other checks are performed by the rules checker 100 using the information stored in the database to make a particular determination.

The first step in the process of the present invention for determining whether a FET is a feedback element is to determine whether or not the element under investigation is a recycle element, as indicated by block 171. If the element under investigation is not part of a recycle loop, it cannot be a feedback element. The rules checker 100 determines whether or not the FET 147 is part of a recycle loop by determining whether or not the FET 147 is contained in an inverter which is cross-coupled with another inverter, which is the case shown in FIG. 4A. If the element being evaluated is not part of a recycle loop, it cannot be a feedback element. In this case, the rules checker 100 would return false, thus indicating that the element under investigation is not a feedback element.

In this example, the rules checker 100 will determine that the element 147 is part of a recycle loop since it is contained in inverter 141 which is cross-coupled with inverter 139. The process will then proceed to the step represented by block 172 and the rules checker 100 will determine whether the source or drain of the element 147 is part of a RAM cell. If the sourcer drain is part of a RAM cell, it can be assumed that the element under investigation is a feedback element. Therefore, if the rules checker 100 determines that the source or drain is part of a RAM cell, the rules checker 100 will return true indicating that the FET under investigation is part of a feedback element.

The rules checker 100 determines whether or not the circuit 138 is a RAM cell by determining whether or not a pass FET, such as NFET 143, that is channel-connected to the latch node NQ is channel-connected to one or more other pass FETs. If so, the pass FET being evaluated is part of a RAM cell. Therefore, in this example, the rules checker 100 will determine that the FET 147 is not part of a RAM cell since there are no pass FETS channel-connected to pass FET 143 shown in FIG. 4A. Therefore, the process will proceed to block 173.

At block 173, the rules checker 100 determines whether or not the output of gate 141 is driven only by gate 141. In this example, the output NQ is not being driven only by gate 141 because it is also being driven by pass FET 143. Therefore, the decision of block 173 will resolve to NO and the process will proceed to block 174. At block 174, the rules checker 100 determines whether or not the gate of the FET being evaluated is a precharge node. If so, the rules checker 100 determines that the FET is not a feedback element and returns false. This is because the gate of a feedback element is never precharged. Precharging normally occurs only in the forward loop. If the rules checker 100 determines that the gate of FET 147 is not a precharge node, the process proceeds to block 176.

Precharge nodes exist in circuits that have been designed using dynamic domino logic, which is well-known to those skilled in the art. Precharge nodes are nodes that are channel-connected to a PFET which has its gate connected to the clock and its source connected to the supply voltage, VDD. Since the gate of FET 147 is not connected to the drain of a PFET which has its gate connected to the clock and its source connected to VDD, the rules checker 100 will determine that the gate of FET 147 is not a precharge node and the process will proceed to block 176. Precharge nodes are identified by Pathmill by flags, which are stored in the database. These flags are utilized by the rules checker 100 to perform the check of block 174. Alternatively, the rules checker 100 could analyze elements connected to the gate of the element being evaluated in order to determine whether or not the gate is a precharge node.

At block 176, the rules checker 100 determines whether or not the gate of the FET being evaluated is a block input. A flag in the database identifies nodes that are block inputs. Since the gate of FET 147 is within a larger circuit, the gate of FET 147 will not be identified as a block input and, therefore, the process will proceed to block 178 in FIG. 6B.

At block 178, the rules checker 100 attempts to locate the output of the gate 141 shown in FIG. 4A that comprises the FET being evaluated. At block 179, the rules checker 100 determines whether or not an output has been found. In certain cases, the output of the gate may be connected to various configurations of NFETs and PFETs and, consequently, the rules checker 100 will not be able to identify an output of the gate. This will indicate that the gate is not an inverter, and since only inverters are allowed in the recycle loop, the inability to identify an output of the gate will indicate that the FET 147 comprised in the gate is not a feedback element. Therefore, the rules checker 100 will return false, thus indicating that the FET comprised in the gate for which an output could not be identified is not a feedback element. However, in this example, the rules checker 100 will identify node NQ as the output of gate 141 and the process will proceed to block 181.

At block 181, the rules checker 100 will determine whether or not the gate of the FET being evaluated is driven by a pass FET. The rules checker will make this determination by determining whether or not any pass FETs are channel-connected to the gate of the FET being evaluated and whether or not the directionality of the pass FET is toward the gate of the FET being evaluated. If so, the rules checker 100 will determine that the FET being evaluated is not a feedback element and will return false. If the rules checker 100 determines that the gate of the FET being evaluated is not channel-connected to any pass FETs, the process will proceed to block 183. Pass FETs are FETs that simply pass a signal, such as the FET 143 shown in FIG. 4A. Pass FETs are used to connect circuits together and they are identified by flags in the information received by the rules checker 100 from Pathmill. In this example, since there are no pass FETs channel-connected to the gate of FET 147, the process will proceed to block 183.

At block 183, the rules checker 100 will determine whether or not the gate of the FET being evaluated is channel-connected to another FET which is not controlled either by the clock or by the output of the gate comprising the FET being evaluated. Therefore, in this example, the rules checker 100 will first determine whether or not the gate of FET 147 is channel-connected to any FETs. Since the gate of FET 147 is only channel-connected to FETs that are in logic gate 139, the rules checker will determine whether or not gate 139, which comprises those FETs, is controlled either by the clock or by the output of the gate 141 comprising the FET 147 being evaluated. Therefore, if the node NQ is either connected directly to a clock or corresponds to the output of the gate 141 comprising FET 147, the decision of the block 183 will resolve to NO. Since NQ corresponds to the output of gate 141, the decision of block 183 will resolve to NO and the process will proceed to block 184.

At block 184, the rules checker 100 determines whether or not the output of the gate 141 comprising the FET 147 being evaluated is connected to the clock. Pathmill provides flags to the rules checker 100 which are stored in the database and utilized by the rules checker to determine whether or not nodes are connected to clocks. In this example, since NQ is not a clock, the process proceeds to block 185 where a determination is made as to whether or not the output of the gate 141 comprising the FET 147 is a precharge node. Since the output of gate 141 is not channel-connected to a PFET which has its gate connected to a clock and its source connected to VDD, the output of gate 141 is not a precharge node. Therefore, the process will proceed to block 186.

At block 186, the rules checker 100 will determine whether or not the output of gate 141 comprising FET 147 is a block input. As stated above, a flag in the database identifies block inputs. Since the node NQ is internal to the circuit comprising the recycle loop 138 and the pass FET 143, the node NQ will not be identified in the database as a block input and the process will proceed to block 187. As with block inputs, the database also comprises flags which identify block outputs. The rules checker 100 utilizes these flags to determine whether or not the node NQ is a block output. Since the output of gate 141 is not a block output, the process will proceed to block 188 in FIG. 6C.

At block 188, the rules checker 100 determines whether or not the output NQ of the gate 141 is driven by a pass FET. Since NQ is driven by pass FET 143, the decision of block 188 resolves to YES and the rules checker 100 returns true indicating that the FET 147 comprised by gate 141 is a feedback element. Therefore, in this example, the task of determining whether or not the FET 147 is a feedback element would be complete and the rules checker 100 could begin evaluating a different element in the circuit or performing some other task. However, in order to illustrate all of the steps in the process, the remaining steps will be discussed.

At block 191, the rules checker 100 determines whether or not the output of the gate comprising the FET being evaluated is channel-connected to any FET which is not controlled either by the clock or by the gate of FET being evaluated. The output NQ is channel-connected to a FET 148 shown in FIG. 4B and to the FET 143 shown in FIG. 4A. However, since the FET 148 is controlled by the gate of FET 147 and since the FET 143 is controlled by the clock, the decision of block 191 will resolve to NO and the process will proceed to block 193.

At block 193, the rules checker 100 determines whether or not the FET being evaluated is a PFET which is not paired with an NFET in an inverter. In other words, the rules checker 100 determines whether or not the FET being evaluated is a PFET and, if so, whether or not the PFET is channel-connected to an NFET. If the rules checker 100 determines that the FET is a PFET and that it is not channel-connected to an NFET controlled by the same signal as the PFET, the rules checker 100 returns true indicating that the PFET is a feedback element. Since FET 147 is channel-connected to NFET 148, the decision of block 193 will resolve to NO and the process will proceed to block 194.

At block 194, the rules checker 100 calculates the effective widths of the NFETs and PFETs of the gates 139 and 141. The rules checker 100 utilizes the widths of the elements which have been stored in the database to calculate the effective NFET and PFET widths for each of the gates. The effective width $W_E$ of the PFET network shown in FIG. 4B is calculated as: $W_E=1/(1/W_1+1/W_2)$, where $W_1$ and $W_2$ represent the widths of the FETs. This equation is also used to calculate the effective width of the NFET network shown in FIG. 4B, where $W_1$ and $W_2$ represent the widths of the NFETs.

Once the effective widths have been calculated, the rules checker proceeds to block 201. At block 201, the rules checker 100 determines whether or not the PFET network and the NFET network in the gate containing the FET being evaluated is stronger than the PFET network and the NFET network in other gate in the recycle loop 138. The strength of a FET is equal to its width divided by its length. The strengths of the PFET and NFET networks in each of the gates 139 and 141 are assumed to the effective widths of the PFET and NFET networks, which were calculated at block 194.

Therefore, in this example, the rules checker 100 determines whether the PFET and NFET networks of the gate 141 are stronger than the PFET and NFET networks of gate 139. If so, the rules checker 100 returns false, thus indicating that the element being evaluated s not a feedback element. This is because the return loop cannot be stronger than the forward loop. If the decision of block 201 resolves to NO, the process will proceed to block 202. At block 202, the rules checker 100 determines whether the PFET and NFET networks in the gate containing the element being evaluated are weaker than those in the opposite gate. If so, the rules checker 100 returns true, thus indicating that the element being evaluated is a feedback element. If not, the process returns false indicating that the element is not a feedback element.

FIG. 7 is a flow chart illustrating the process of detecting a zero catcher circuit. Preferably, this process is performed prior to the process of FIGS. 6A–6C. Furthermore, depending on the results of the process of FIG. 7, the process of FIGS. 6A–6C may not need to be performed at all. The process of FIG. 7 will be discussed with reference to the zero catcher circuit shown in FIG. 5. The zero catcher circuit 155 shown in FIG. 5 is a special case and when the rules checker 100 identifies a circuit as corresponding to a special case, then rules checker 100 can definitively determine whether or not the element being evaluated is a feedback element. In accordance with the preferred embodiment, if the rules checker 100 determines at any point in the process of FIG. 7 that the circuit does not correspond to the special case, then the rules checker 100 performs the process of FIGS. 6A–6C to determine whether or not the element being evaluated is a feedback element.

In order to demonstrate an example of the application of the method of FIG. 7, FET 161, which is the feedback FET in the zero catcher circuit 155, will be evaluated. The first step in the process of detecting a special case is to determine whether the gate output of the circuit 155, which corresponds to node A, is driven by another gate, as indicated by block 205. In order to make this determination, the rules checker 100 determines whether or not there are any FETs that are channel-connected to node A that have their gates driven by a signal other than the signal driving the gate of the FET being evaluated. In this example, the only FETs that are channel-connected to node A are FETs 156 and 157 and FETs (not shown) in inverter 158. Therefore, the rules checker 100 then determines whether or not the gates of any of those FETs are driven by a signal other than the signal on line 163. If not, the rules checker 100 determines that the circuit is not a special case, as indicated by block 206. As stated above, whenever a determination is made by the rules checker that it has not detected a special case, the rules checker 100 performs the process illustrated in FIGS. 6A–6C.

If a determination is made at block 205 that the gate output is driven by another gate, thus indicating that it is still possible that the circuit is a zero catcher circuit, then the process proceeds to block 207. At block 207, if the element being evaluated is a PFET, a determination is made as to whether or not the source or drain terminals of the PFET are tied to VDD. If the element being evaluated is an NFET, then a determination is made as to whether or not the source or drain of the NFET is tied to ground. If either of these conditions, as applied under the circumstances, is not true, the circuit cannot be a zero catcher circuit. If the decision of block 207 resolves to NO, the process proceeds to block 208, i.e., the rules checker 100 determines that the circuit is not a special case. If the decision of block 207 resolves to YES, the process proceeds to block 209. Since the FET 161 is channel-connected to ground, the decision will resolve to YES and the process will proceed to block 209.

At block 209, a determination is made as to whether or not the gate is tied to a supply. If so, the rules checker determines that the circuit is not a special case, as indicated by block 210. If not, the process proceeds to block 211 and the rules checker begins evaluating a first channel-connected element connected to the gate of the element being evaluated, as indicated by block 211. In this example, only FETs comprised by inverter 159 will be channel-connected to the gate of FET 161. The rules checker determines whether or not the element is a PFET, as indicated by block 212. If not, the process proceeds to block 215. If so, the process proceeds to block 213.

At block 213, the rules checker 100 determines whether or not the gate of the element, which will be connected to node A, is driven by an NFET structure of a zero catcher circuit. An NFET structure of a zero catcher circuit is a network of three NFETs connected to ground. The NFETs 157, 161 and 162 correspond to this structure. The rules checker 100 loops traverses through all of the channel-connected elements connected to A and determines whether the NFET structure comprising NFETs 157, 161 and 162 exist. The rules checker 100 determines whether one of the FETs has its gate connected to the clock and whether one of the FETs is the FET being evaluated. As stated above, nodes which are tied to ground or to a clock are identified in the database. If all of these conditions are true, the rules checker 100 determines that a special case has been detected, as indicated by block 214. The process ends at this point because the rules checker 100 has determined that the FET being evaluated is the feedback FET of a zero catcher circuit.

If all of these conditions have not been met, the decision of block 213 resolves to NO and the process proceeds to block 215 and obtains the next element that is channel-connected to the element being evaluated. The process also proceeds to block 215 from block 212 if a determination is made at block 212 that the element is not a PFET. At block 216, the rules checker 100 determines whether or not the element it has obtained at block 215 is the last element connected to the gate of the element being evaluated. If so, the rules checker 100 determines that the circuit is not a special case, as indicated by block 217. This is because, if this is the last element, the NFET structure of a zero catcher will not be found since it requires three NFETs. The rules checker 100 then performs the process illustrated in FIGS. 6A–6C.

If a determination is made at block 216 that the current element is not the last element, then the process proceeds to block 212. The steps represented by blocks 212 through 216 continue to be performed until the process proceeds either to blocks 214 or to block 217 indicating that either a special case has been detected or that a determination has been made that the circuit is not a special case, respectively. As stated above, when a determination is made that the circuit is not a special case, the rules checker 100 performs the process of FIGS. 6A–6C.

It should be noted that the electrical rules checker 100 could perform a similar routine to detect a ones catcher circuit. A ones catcher circuit is very similar to the zero catcher circuit shown in FIG. 5 except that the NFETs in the zero catcher circuit are replaced by PFETs in the ones catcher circuit and the PFETs in the zero catcher circuit are replaced by NFETs in the ones catcher circuit. In this case, ground will be connected to the NFET that replaces the PFET 156 and the PFETs which replace NFETs 161 and 162 will be connected to VDD. Those skilled in the art will understand the manner in which the routine of FIG. 7 could be modified to detect a ones catcher circuit and to determine whether or not a FET is a feedback element in the ones catcher circuit.

It should be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. A computer configured to execute a rules checker program comprising:
   logic configured to analyze information relating to a network; and
   logic configured to determines based on the analyzed information, whether or not an element comprised in an integrated circuit is a feedback element, wherein said feedback element is a field effect transistor.

2. The computer of claim 1, wherein the rules checker program first determines whether or not the element being evaluated is a comprised in a recycle loop, wherein if a determination is made that the element is not comprised in a recycle loop, the rules checker program determines that the element is not a feedback element.

3. The computer of claim 2, wherein if the rules checker program determines that the transistor is comprised in a recycle loop, then the rules checker program determines whether or not a source or drain terminal of the transistor is connected to a RAM cell, wherein if the rules checker program determines that the source or drain of the transistor is connected to a RAM cell, the rules checker program determines that the transistor is a feedback element.

4. The computer of claim 3, wherein if the rules checker program determines that source or drain of the transistor is not connected to a RAM cell, the rules checker program determines whether or not a gate terminal of the transistor being evaluated is a precharge node, wherein if the rules checker program determines that the gate terminal of the transistor is a precharge node, the rules checker program determines that the transistor is not a feedback element.

5. The computer of claim 4, wherein if the rules checker program determines that the gate terminal of the transistor is not a precharge node, the rules checker program determines whether or not the gate terminal of the transistor corresponds to a block input of the network comprising the transistor, wherein if the rules checker program determines that the gate terminal of the transistor being evaluated is a block input, the rules checker program determines that the transistor being evaluated is not a feedback element.

6. The computer of claim 5, wherein if the rules checker program determines that the gate terminal of the transistor being evaluated is not a block input, then the rules checker program determines whether or not an output of a return inverter comprised by the recycle loop is only driven by the return inverter, wherein if the rules checker program determines that the output of the return inverter is only driven by the return inverter, the rules checker program determines that the transistor being evaluated is not a feedback element.

7. The computer of claim 6, wherein if the rules checker determines that the output of the return inverter is not driven only by the return inverter, the rules checker program determines whether or not a gate terminal of the transistor being evaluated is driven by a pass transistor, wherein if the rules checker program determines that the gate terminal of the transistor is driven by a pass transistor, the rules checker program determines that the transistor being evaluated is not a feedback element, wherein if the rules checker program determines that the gate terminal of the transistor being evaluated is not driven by a pass transistor, the rules checker program determines whether or not the gate terminal is channel-connected to another transistor which is not controlled either by a clock or by an output of the logic gate comprising the transistor being evaluated, wherein if the rules checker program determines that the gate terminal is not channel-connected to another transistor which not is controlled by a clock or by an output of the logic gate comprising the transistor being evaluated, the rules checker program determines that the transistor being evaluated is a feedback element.

8. The computer of claim 7, wherein the recycle loop comprises a first inverter and a second inverter, the transistor being evaluated being comprised in the first inverter, the first inverter corresponding to said logic gate, wherein if the rules checker program determines that the gate terminal is channel-connected to another transistor which is not controlled either by a clock or by an output of the logic gate comprising the transistor being evaluated, the rules checker program determines whether an N field effect transistor network and a P field effect transistor network comprised in the first inverter are both stronger than an N field effect transistor network and a P field effect transistor network, respectively, comprised in the second inverter, wherein if the rules checker program determines that the N field effect transistor network and the P field effect transistor network comprised in the first inverter are both stronger than the N field effect transistor network and the P field effect transistor network comprised in the second inverter, the rules checker program determines that the transistor being evaluated is not a feedback element.

9. The computer of claim 8, wherein if the rules checker program determines that the N field effect transistor network and the P field effect transistor network comprised in the first inverter are both stronger than the N field effect transistor network and the P field effect transistor network comprised in the second inverter, the rules checker program determines whether an N field effect transistor network and a P field effect transistor network comprised in the first inverter are both weaker than the N field effect transistor network and the P field effect transistor network, respectively, comprised in the second inverter, wherein if the rules checker program determines that the N field effect transistor network and the P field effect transistor network comprised in the first inverter are not both weaker than the N field effect transistor network and the P field effect transistor network comprised in the second inverter, the rules checker program determines that the transistor being evaluated is a feedback element.

10. The computer of claim 1, wherein the rules checker program determines whether or not the transistor being evaluated is a feedback element by determining whether or not the transistor is comprised in a particular type of circuit, the particular type of circuit corresponding to a special case, wherein if the rules checker program determines that the element being evaluated is comprised in the particular type of circuit, the rules checker program determines that the transistor being evaluated is a feedback element.

11. The computer of claim 10, wherein the particular type of circuit corresponds to a zero catcher circuit and wherein the rules checker program performs a plurality of checks to determine whether or not the particular type of circuit is a zero catcher circuit.

12. The computer of claim 11, wherein the particular type of circuit corresponds to a ones catcher circuit and wherein the rules checker program performs a plurality of checks to determine whether or not the particular type of circuit is a ones catcher circuit.

13. A method comprising:
analyzing, by a computer, information relating to a network; and
determining, based on the analyzing, whether or not an element comprised in an integrated circuit is a feedback element, wherein said feedback element is a field effect transistor.

14. The method of claim 13, wherein during the analyzing step, the rules checker program first determines whether or not the element being evaluated is comprised in a recycle loop, wherein if a determination is made that the transistor is not comprised in a recycle loop, the rules checker program determines that the transistor is not a feedback element.

15. The method of claim 14, wherein if, during the analyzing step, the rules checker program determines that the transistor is comprised by a recycle loop, then the rules checker program determines whether or not a source or drain of the transistor is connected to a RAM cell, wherein if the rules checker program determines that the source or drain of the transistor is connected to a RAM cell, the rules checker program determines that the transistor is a feedback element.

16. The method of claim 15, wherein if, during the analyzing step, the rules checker program determines that the source or drain of the transistor is not part of a RAM cell, then the rules checker program determines whether or not a gate terminal of the transistor being evaluated is a precharge node, wherein if the rules checker program determines that the gate terminal of the transistor being evaluated is a precharge node, the rules checker program determines that the transistor being evaluated is not a feedback element.

17. A computer program comprising:
a first code segment which analyzes information relating to a network; and
a second code segment configured to determine, based on the analyzed information, whether or not an element comprised in an integrated circuit is a feedback element, wherein said feedback element includes a transistor;
wherein the first code segment first determines whether or not the element being evaluated is comprised in a recycle loop, wherein if a determination is made by the first code segment that the transistor is not comprised in a recycle loop, the program determines that the transistor is not a feedback element.

18. The program of claim 17, wherein if the first code segment determines that the transistor is comprised by a recycle loop, then the first code segment determines whether or not a source or drain of the transistor is connected to a RAM cell, wherein if the first code segment determines that the source or drain of the transistor is connected to a RAM cell, the program determines that the transistor is a feedback element, and wherein if first code segment determines that the source or drain of the transistor is not part of a RAM cell, then the first code segment determines whether or not the gate terminal of the transistor is a precharge node, wherein if the rules checker program determines that the gate terminal of the transistor is a precharge node, the rules checker program determines that the transistor is not a feedback element.

19. The computer program of claim 17, wherein the first code segment determines whether or not the element being evaluated is a feedback element by determining whether or not the element is comprised in a particular type of circuit, the particular type of circuit corresponding to a special case, wherein if the first code segment determines that the element being evaluated is comprised in the particular type of circuit, the first code segment determines that the element being evaluated is a feedback element.

* * * * *

UNITED STATES PATENT AND TRADEMARK OFFICE
CERTIFICATE OF CORRECTION

| | |
|---|---|
| PATENT NO. | : 6,990,643 B1 |
| APPLICATION NO. | : 09/311313 |
| DATED | : January 24, 2006 |
| INVENTOR(S) | : John G McBride |

Page 1 of 1

It is certified that error appears in the above-identified patent and that said Letters Patent is hereby corrected as shown below:

In column 15, line 36, in Claim 1, delete "determines" and insert -- determine, --, therefor.

In column 15, line 42, in Claim 2, delete "a" before "comprised".

Signed and Sealed this

Twenty-third Day of June, 2009

JOHN DOLL
*Acting Director of the United States Patent and Trademark Office*